United States Patent [19]

Dohjo et al.

[11] Patent Number: 4,905,066
[45] Date of Patent: Feb. 27, 1990

[54] THIN-FILM TRANSISTOR

[75] Inventors: Masayuki Dohjo; Yasuhisa Oana; Mitsushi Ikeda, all of Yokohama, Japan

[73] Assignee: Kabushiki Kaisha Toshiba, Kawasaki, Japan

[21] Appl. No.: 340,546

[22] Filed: Apr. 19, 1989

[30] Foreign Application Priority Data

May 19, 1988 [JP] Japan .................................. 63-122771

[51] Int. Cl.[4] ............................................ H01L 29/78
[52] U.S. Cl. ................... 357/23.15; 357/23.7; 357/54; 357/67
[58] Field of Search ................... 357/23.7, 23.15, 54, 357/67

[56] References Cited

U.S. PATENT DOCUMENTS

4,531,144  7/1985  Holmberg .............................. 357/67

Primary Examiner—Edward J. Wojciechowicz
Attorney, Agent, or Firm—Oblon, Spivak, McClelland, Maier & Neustadt

[57] ABSTRACT

A thin-film transistor comprising a substrate, a gate electrode formed on said substrate and made of molybdenum-tantalum alloy containing 60 to 85 atomic % of tantalum gate insulation film formed on said gate electrode and made of a laminated layer including silicon nitride film and oxide film formed by oxidizing the surface of said gate electrode, semiconductor film formed on said gate insulation film and contacting the silicon nitride film, and source and drain electrodes formed on the semiconductor film.

6 Claims, 7 Drawing Sheets

THIN-FILM TRANSISTOR

BACKGROUND OF THE INVENTION

1. Field of the Invention

The present invention relates to a thin-film transistor which comprises a substrate, a gate electrode formed on the substrate, a gate insulation layer formed on the gate electrode, and a semiconductor layer formed on the gate insulation layer. The thin-film transistor is designed for use in, for example, an active matrix liquid-crystal display.

2. Description of the Prior Art

Figure 1:
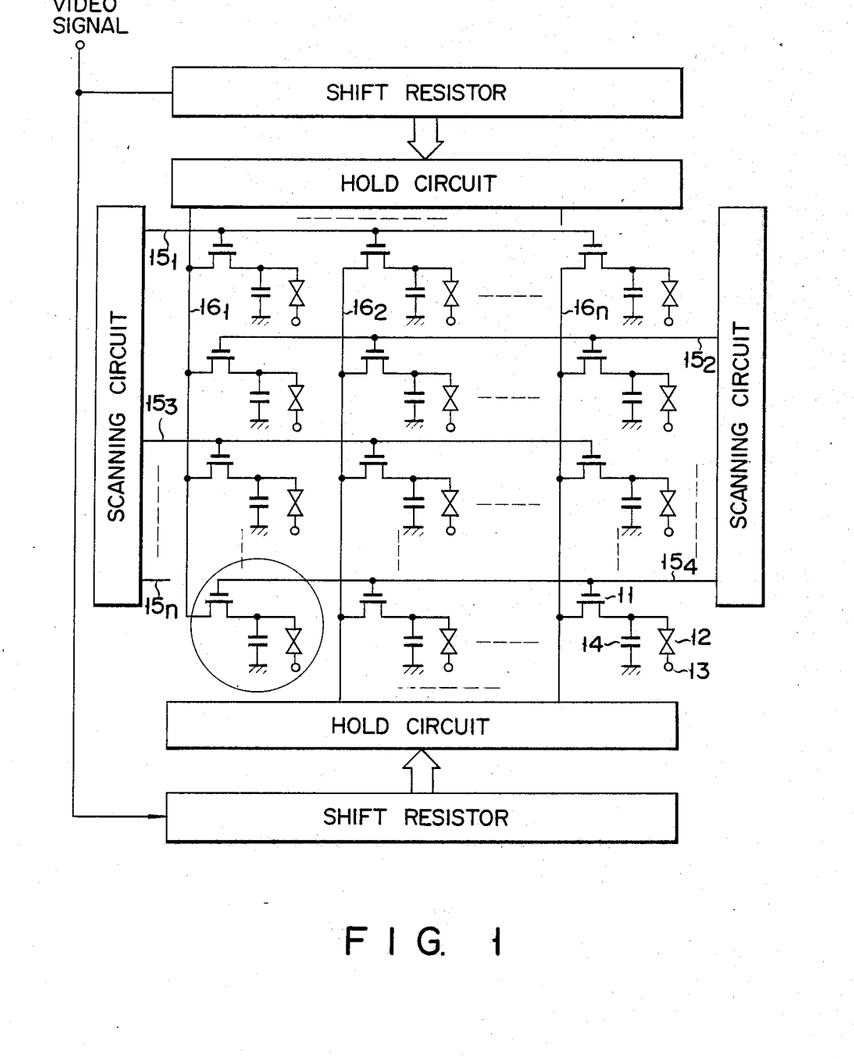
FIG. 1 is a circuit diagram showing the active matrix liquid-crystal display in which the TFT according to the invention is incorporated.

Attention is being paid to a thin-film transistor (TFT) which has amorphous silicon (a-Si) film and can be used as a switching element for an active matrix liquid-crystal display. FIG. 1 is a circuit diagram showing an active matrix liquid-crystal display having TFTs.

The display has many pixels arranged in rows and columns, one of which is enclosed within a circle in FIG. 1. Each pixel comprises a TFT 11, a liquid-crystal cell 12, an electrode 13, and a capacitor 14. The display has address lines $15_l$ to $15_m$ and data lines $16_l$ to $16_n$. The gates of the TFTs of each row are coupled to the same address line. The sources or drains of the TFTs of each column are connected to the same data line. The use of the TFTs enables the display apparatus to display images of higher quality than an ordinary matrix liquid-crystal display which has no such switching elements.

Each TET of the active matrix liquid-crystal display shown in FIG. 1 includes an a-Si layer formed on a glass substrate. Since an a Si-layer can be formed at low temperature, an array of TFTs can be formed on a single glass substrate, in such a matrix pattern as is shown in FIG. 1. The use of a-Si and a glass substrate makes it possible to manufacture planar liquid-crystal display which is large, highly precise, and capable of displaying high-quality images.

As can be understood from FIG. 1, the address lines $15_l$ to $15_m$ must be both long and slender in order to provide a large, high-quality active matrix liquid-crystal display. Hence, it is required that these lines be made of greatly conductive material to have a relatively low resistance. In particular, it is difficult to satisfy the requirement for low resistance of the address lines, i.e., the gate electrodes of the TFTs when the TFTs are of the so-called inverted staggered type which is made by forming the gate electrodes on a glass substrate, then forming a gate insulation layer on the address lines, and finally forming a-Si film on the gate insulation layer. The reason of the difficulty is that the gate electrodes which is extremely thin must satisfy another requirement for resistance to the chemicals applied during the manufacture of the active matrix liquid-crystal display as well as the requirement for the high conductivity.

Film of a metal such tantalum (Ta) has been used as material of such gate electrodes. To manufacture a larger, high-quality active matrix liquid-crystal display, there is a great demand for other material which has a lower resistivity, a great workability, and a higher resistance to chemicals.

The more densely the display elements are arranged, the greater the total area of the intersections of the address lines $15_l$ to $15_m$ and data lines $16_l$ to $16_n$. Therefore, the insulation film interposed between the liens $15_l$ to $15_m$, on the one hand, and the lines $16_l$ to $16_n$, on the other, must have a great insulating strength. This interlayer insulation film is formed at the same time, and of the same insulative material, as the gate insulation film. Hence, the gate insulation film must also have an adequate insulating strength and must provide good interface characteristics between the insulation film and the a-Si film formed thereon.

In order to provide a large, active matrix liquid-crystal display which includes a-Si film and display elements densely arranged in rows and columns, it is absolutely necessary to reduce the resistance of the gate electrodes of the TFTs incorporated in the display elements, and to use gate insulation film which has a great insulating strength and provides good interface characteristics along with the a-Si film.

SUMMARY OF THE INVENTION

The object of this invention is to provide greatly efficient TFTs which can be used to manufacture a large, high-quality active matrix liquid-crystal display. More particularly, the object of the invention is to provide a TFT which comprises a gate electrode having a high conductivity, and gate insulation film having a sufficient insulating strength and good interface characteristics along with a-Si film.

According to the present invention, there is provided a thin-film transistor comprising: a substrate; a gate electrode formed on the substrate and made of Mo-Ta alloy containing 60 to 85 atomic % of tantalum; gate insulation film formed on the gate electrode and made of a laminated layer including silicon nitride film and oxide film formed by oxidizing the surface of the gate electrode; semiconductor film formed on the gate insulation film and contacting the silicon nitride film; and source and drain electrodes formed on the semiconductor film.

The Mo-Ta alloy, which contains 60 to 85 atomic % of Ta, is able to attain an extremely low resistivity, about $50\mu\Omega\cdot cm$. In addition, the oxide film formed by oxidizing the surface of the Mo-Ta alloy gate electrode has a very high insulating strength of 2.5 MV/cm or more, and therefore is excellent gate insulation film.

Since the oxide film of the Mo-Ta alloy is combined with the silicon nitride film, th resultant composite film has excellent insulation properties. Further, the silicon nitride film can provides, along with the a-Si film, good interface characteristics. Hence, when the a-Si film is formed on the silicon nitride film, an interface of good characteristics will be formed between the gate insulation film and the a-Si film.

The present invention therefore, provide a high-efficiency TFT. When this TFT is use in great numbers, thus forming an active matrix substrate, it will be possible to provide a large, high-quality liquid crystal display.

DETAILED DESCRIPTION OF THE PREFERRED EMBODIMENTS

The present invention will not be described in grater detail, with reference to a few embodiments.

As can be clear from the foregoing, the object of this invention is to improve the properties of the gate electrode and gate insulation film of a TFT.

Figure 2:
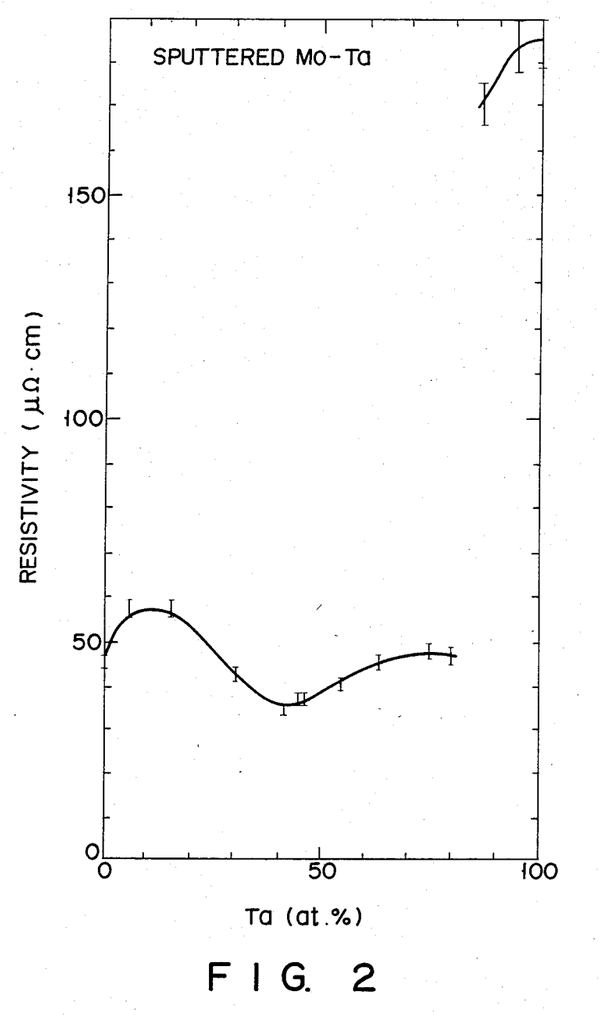
FIG. 2 is a graph representing the relationship between the Ta content of Mo-Ta alloy and the resistivity thereof.

The inventors hereof have first conducted experiments, in order to determine how the resistivity of Mo-Ta alloy film formed by sputtering depends upon the content of Ta. The results of the experiments were as is shown in FIG. 2. As is evident from FIG. 2, the resistivity of the Mo-Ta alloy film drastically increases when the Ta content is over 85 atomic %. This is why the Ta content is 85 atomic % or less in the present invention.

Figure 3:
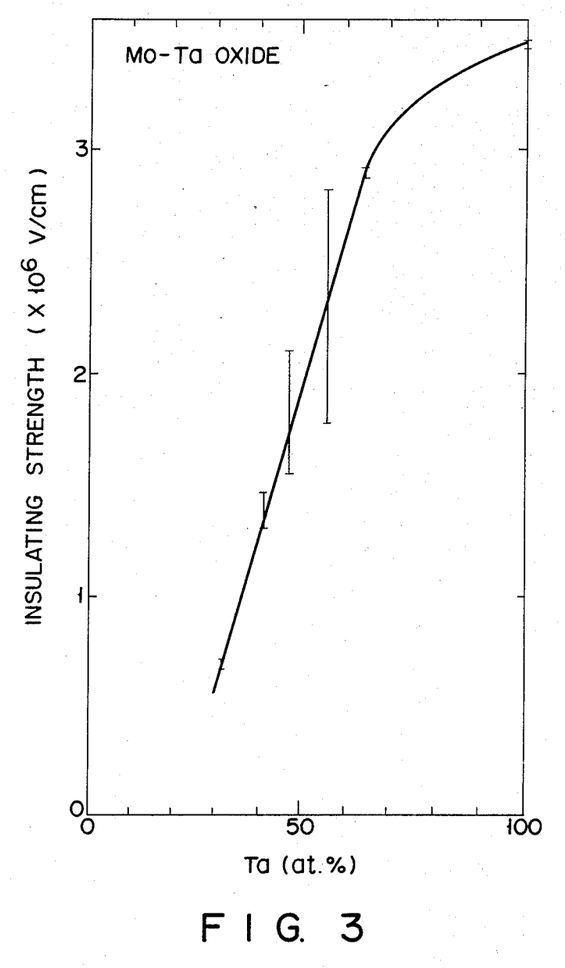
FIG. 3 is a graph showing the relationship between the Ta content of Mo-Ta alloy and the insulating strength of the oxide film of this alloy, which has been formed by a-nodic oxidation.

Then, the inventors studied how the insulation breakdown voltage of the oxide film of the Mo-Ta alloy, which has been formed by anodic oxidation, depends upon the Ta content of the Mo-Ta alloy. The results were as is shown in FIG. 3. The gate voltage of the TFTs commonly used ranges from 20 to 25V, and the gate insulation film must have an insulating strength of 2.5MV/cm or more including safety margin. FIG. 3 teaches that gate insulation film obtained by oxidation of an Mo-Ta alloy had a sufficient insulating strength when the Ta content of this alloy was 60 atomic % or more. This is why the Ta content is 60 atomic % or more in the present invention. Further, as can be seen from FIG. 3, the insulating strength of the insulating film formed by anodic oxidation of the Mo-Ta alloy film decreased in relatively greater ratio depending Ta content decrease when the Ta content of the Mo-Ta alloy was less than 60 atomic %. It is preferable, also in view of this fact, that the Ta content be at least 60 atomic %.

From FIGS. 2 and , it is understood that an Mo-Ta alloy film containing 60 to 85 atomic % of Ta has a resistivity lower than that of Ta film, Mo film, or Cr film, and the insulation film obtained by anodic oxidation of the alloy exhibits a sufficient insulating strength of 2.5 MV/cm or more.

Figure 4:
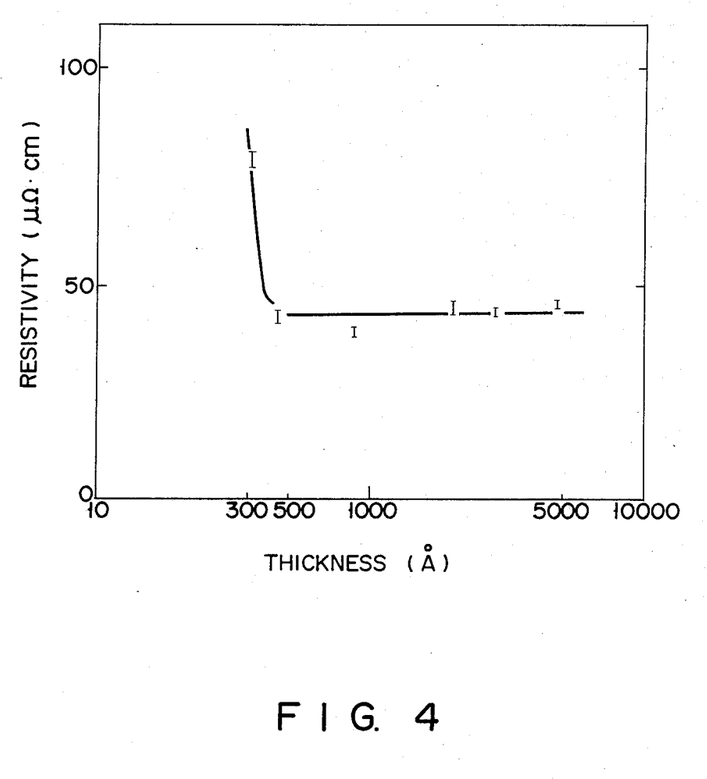
FIG. 4 is a graph illustrating the relationship between the thickness and resistivity of the Mo-Ta alloy film used in the invention.

The inventors hereof further conducted experiments to see how the resistivity of the Mo-Ta alloy film containing 60 to 85 atomic % of Ta depends upon its thickness. The results of the experiments were as is shown in FIG. 4. As is clear from FIG. 4, the film should better be 500 Å or more thick to have an adequately low resistivity.

A TFT according to the present invention, which has the gate electrode made of the above-mentioned Mo-ta alloy, will now be described with reference to FIG. 5.

Figure 5:
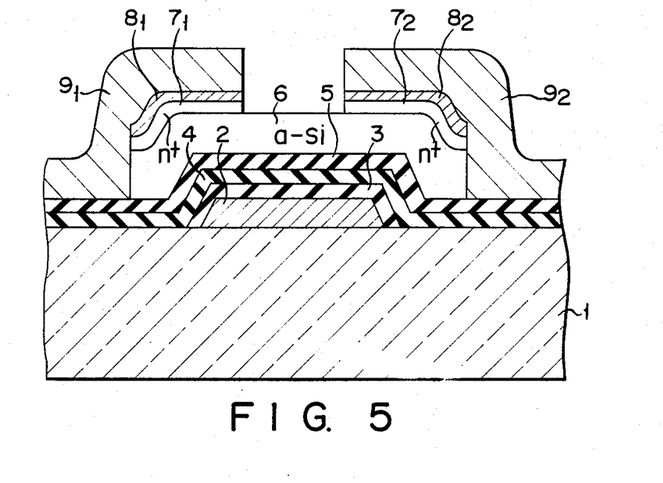
FIG. 5 is a cross-sectional view showing a TFT according to an embodiment of the present invention.

As is shown in FIG. 5, this TFT is of the inverted, staggered type. The TFT comprises a glass substrate 1 and a gate electrode 2 formed on the substrate 1. The gate electrode 2 functions as one of the address liens $15_l$ to $15_m$ of the active matrix liquid-crystal display shown in FIG. 1. The electrode 2 is made of film having a thickness of 2800 Å and formed of an Mo-ta alloy containing 60 to 85 atomic %.

Oxide film 3 is formed on the gate electrode 2, by anodic oxidation of the electrode 2. Silicon oxide ($SiO_x$) film 4 is formed on the glass substrate 1 and the oxide film 3. Further, silicon nitride film 5 is formed on the $SiO_x$ film 4. The oxide film 3, the $SiO_x$ film 4, and silicon nitride film 5 constitute a composite gate insulation film. An $n^-$ type a-Si layer 6, i.e., a patterned semiconductor layer, is formed on this gate insulation film. A source electrode $9_1$ and a drain electrode $9_2$, both made of aluminum, are formed on the gate insulation film and also on the a-Si layer 6. Interposed between the a-Si layer 6, on the one hand, and the electrodes $9_1$ and $9_2$, on the other hand, are $n^+$ type a-Si layers $7_1$ and $7_2$ and Mo layers $8_1$ and $8_2$, all serving as ohmic contact layers.

The TFT shown in FIG. 5 can be manufactured in the following way. First, a glass substrate 1 made of, for example, Corning 7059, is prepared. A film of Mo-Ta alloy is formed on the substrate 1 by means of sputtering. This Mo-Ta alloy film is patterned, thereby forming a gate electrode 2. The gate electrode 2 is subjected to anodic oxidation, forming oxide film 3 on the surface of the gate electrode 2. More specifically, the structure consisting of the substrate 1 and the electrode 2 is immersed in 0.01% citric acid, while gradually increasing the voltage applied to the structure to 100 V at constant current of about 0.3 mA/cm$^2$, thereby performing anodic oxidation on the gate electrode 2. Then, the structure is subjected to anodic oxidation at constant voltage of 100 V for one hour. Thereafter, $SiO_x$ film 4 having a thickness of 1500 Å, silicon nitride film 5 having a thickness of 500 Å, $n^-$type a-Si film 6 having a thickness of 500 Å, and $n^+$-type a-Si film 7 having a thickness of 300 Å are sequentially formed one upon another, by means of plasma chemical vapor deposition, thereby forming a laminated structure. Next, Mo film 8 having a thickness of 500 Å is formed on the surface of this laminated structure by means of sputtering. The uppermost three films 6, 7, and 8 are patterned in the form of an island. An aluminum layer is formed on the entire surface of the structure by evaporation, and is patterned to form a source electrode $9_1$ and a drain electrode $9_2$. In the patterning, Mo film 8 is also patterned simultaneously. Finally, the portions of the $n^+$-type a-Si film 7, which are located above a channel region, are etched away, thus manufacturing a TFT.

The gate electrode 2 of the TFT described above is made of the Mo-Ta alloy having a low resistivity. Thus, when the TFT is used in great numbers in an active matrix liquid-crystal display, the total resistance of the address lines of the display is relatively low. In addition, since the anodically oxidized film 3 has a great insulating strength, an excellent withstand performance against gate destruction is obtained. Moreover, the composite gate insulation film, which consists of the film 3, the $SiO_x$ film 4, and silicon nitride film 5, has excellent insulating strength enough to prevent a current from leaking from the gate electrode 2. Further, since the a-Si film 6 contacts the silicon nitride film 5, the interface between gate insulation film and the a-Si film 6 has good characteristics, raising the operating efficiency of the TFT.

Of the three films forming the gate insulation film, the $SiO_x$ film 4 functions as an etching stopper in patterning the a-Si film 6. More precisely, the $SiO_x$ layer 4 is not etched even in the case where the silicon nitride film 5 is also etched, together with the a-Si film 6. In other words, even if the silicon nitride film 5 is etched for some reason, both the SiO$_x$ film 4 and the anodically oxidized film 3 remain intact, and provide a great insulation strength for the gate insulation film.

When the TFT of this invention is incorporated into the active matrix liquid-crystal display shown in FIG. 1, the SiO$_x$ film 4 plays a very important role. Since it functions as an etching stopper, the film 4 imparts a sufficient insulating strength to the interlayer insulation film interposed between the address lines 15$_l$ to 15$_m$, on the one hand, and the data lines 16$_l$ to 16$_n$, on the other, as will be discussed below.

In the liquid-crystal display, each group of the TFTs are arranged such that their gate electrodes 2 are aligned in one line and connected, thus forming one of the address lines 15$_l$ to 15$_m$, and that their source electrodes 9$_1$ or drain electrodes 9$_2$ are aligned in one line and connected thus forming one of the data lines 16$_l$ to 16$_n$ extending at right angles to the address lines 15$_l$ to 15$_m$. During the manufacture of the TFTs, the portion of the a-Si film 6 which lies at the intersection of any address line and any data line may be etched away. If this is the case, the silicon nitride film 5 may be also etched. Even if this occurs, the SiO$_x$ film 4 and the anodically oxidized film 3 remain intact and serve as a inter-layer insulation film having a great insulating strength enough to prevent short circuiting between the address line and the data line.

Figure 6:
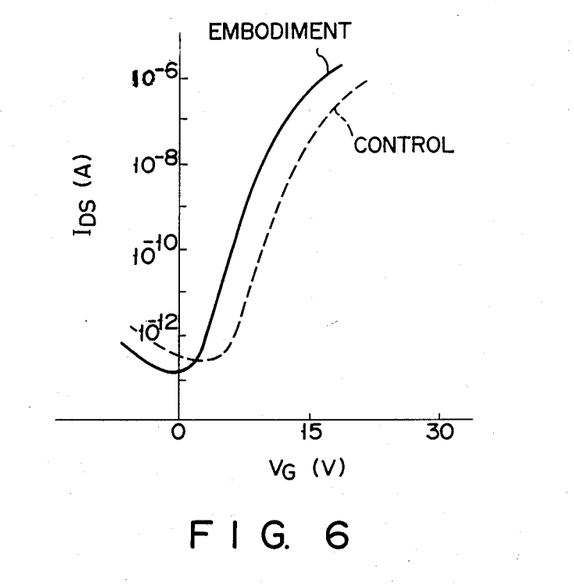
FIG. 6 is a graph showing the relationship between the gate voltage and drain current of the TFT shown in FIG. 5.

In operation, when a voltage higher than a threshold value was applied to the gate electrode 2, a channel was formed in the a-Si film 6. An electric current flowed via this channel from the source electrode 9$_1$ to the drain electrode 9$_2$. Since the a-Si film 6 was extremely thin, its resistance measured in the thickness direction was negligibly low. It was found that the gate voltage and the drain current had the specific relationship represented by the solid curve in FIG. 6. The broken curve in FIG. 6 shows the relationship between the gate voltage and the drain current of a control TFT different from the TFT shown in FIG. 5, only in that CVD SiO$_2$ film was used as the gate insulation film. As is evident from FIG. 6, the TFT of this invention has a leakage current smaller than at of the control TFT, and also a transconductance greater than that of the control TFT.

As has been described, the TFT according to the present invention has a high gate breakdown voltage, a small leakage current and a high operating efficiency.

Figure 7:
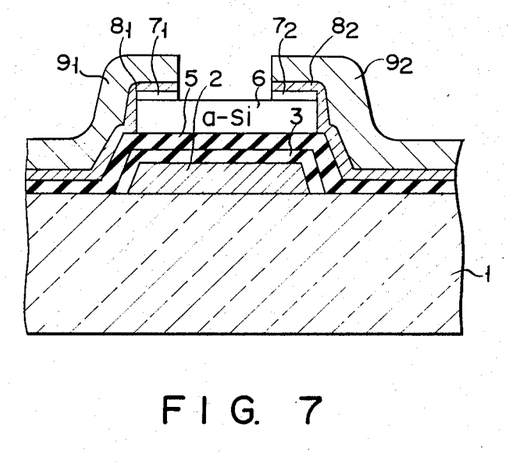
FIGS. 7, 8 and 9 are cross-sectional views illustrating two other embodiments of the present invention.

FIG. 7 illustrates a TFT according to a second embodiment of the invention. This TFT is different from the TFT shown in FIG. 5 in that the composite film consisting of only anodically oxidized film 3 and silicon nitride film 5 is used as the gate insulation film. Since the gate insulation film is composed of the anodically oxidized film 3 and the silicon nitride film 5, the TFT shown in FIG. 7 has as good characteristics as the TFT illustrated in FIG. 5.

Figure 8:
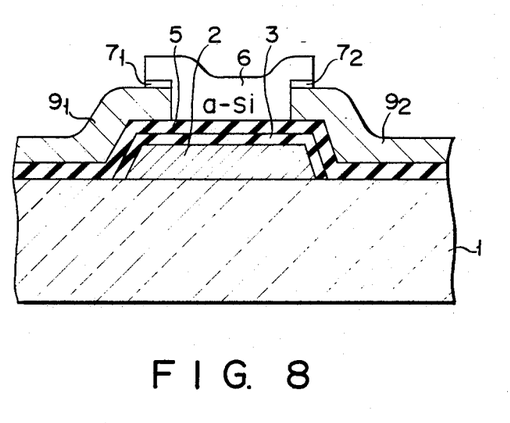

FIG. 8 shows a TFT according to a third embodiment of the present invention. This TFT is different from those shown in FIGS. 5 and 7 in that the source electrode 9$_1$ and drain electrode 9$_2$, and the a-Si film 6 are laid in the reverse order, on upon another. Therefore, the TFT is of a coplanar structure; the gate electrode 2, the source electrode 9$_1$ and the drain electrode 9$_2$ are on the same side of the semiconductor layer 6. However, it can be regarded to have an inverted coplanar structure since the gate electrode 2 is mounted beneath the semiconductor layer 6. In conclusion, the present invention can apply to any TFT that includes a gate electrode formed on a substrate, a gate insulation film formed on the gate electrode, and a semiconductor film formed on the gate insulation film.

Figure 9:
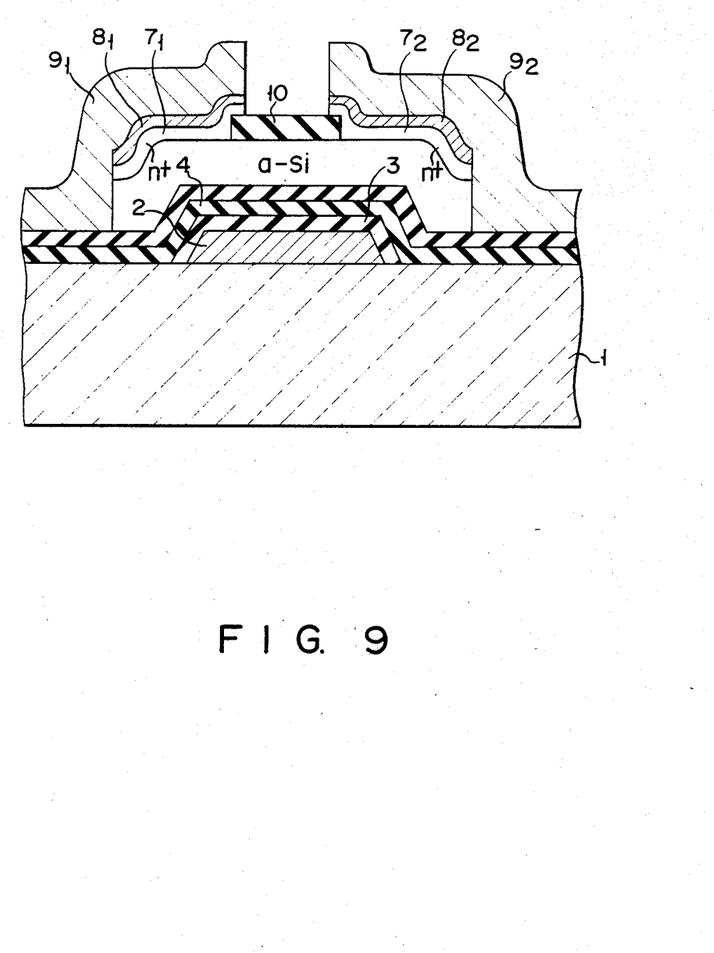

FIG. 9 illustrates another embodiment of the present invention, which is different from the embodiment shown in FIG. 5 only in that a passivation film 10 covers the a-Si film 6. The passivation film 10 is deposited sequentially after the formation of the a-Si film without disposing the a-Si film into the atmosphere, thus preventing the characteristics of the TFT from deteriorating. The passivation film 10 is made of, for example, a silicon nitride film, a laminate of a silicon nitride film and a SiO$_x$ film, or the like.

The present invention is not limited to the embodiments described above. For instance, the surface of the gate electrode made of Mo-Ta alloy film can be thermally oxidized or plasma-oxidized not anodically oxidized as in the above embodiments, thereby forming an oxide film which is the primary component of the gate insulation film. In this case, too, the resultant TFT can exhibit excellent characteristics. Furthermore, any insulative substrate can be used instead of the glass substrate. Still further, the substrate can be made of either metal or semiconductor material, provided that it is covered or coated with insulative material.

As has been explained, the TFT of the present invention exhibits good characteristics owing to the Mo-Ta alloy gate electrode having a predetermined Ta content and the composite gate insulation film including a oxide film of the alloy and a silicon nitride film, and can function effectively when it is employed in a large, high-quality, active matrix liquid-crystal display.

What is claimed is:

1. A thin-film transistor comprising:
   a substrate;
   a gate electrode formed in said substrate and made of molybdenum-tantalum alloy containing 60 to 85 atomic of tantalum;
   gate insulation film formed on said gate electrode and made of a laminated layer including silicon nitride film and oxide film formed by oxidizing the surface of said gate electrode;
   semiconductor film formed on said gate insulation film and contacting the silicon nitride film; and
   source and drain electrodes formed on the semiconductor film.

2. The thin-film transistor according to claim 1, wherein said gate electrode has a thickness of at least 500 Å.

3. The thin-film transistor according to claim 1, wherein said semiconductor film is made of a-Si.

4. The thin-film transistor according to claim 1, wherein said oxide film is an anodically oxidized film.

5. The thin-film transistor according to claim 1, further comprising silicon oxide (SiO$_x$) film interposed between said oxide film and said silicon nitride film.

6. The thin-film transistor according to claim 1, further comprising passivation film covering the portions of said semiconductor film other than those portions contacting said source and drain electrodes.

* * * * *